United States Patent
Weber et al.

(10) Patent No.: US 11,211,483 B2
(45) Date of Patent: Dec. 28, 2021

(54) METHOD FOR FORMING AN INSULATION LAYER IN A SEMICONDUCTOR BODY AND TRANSISTOR DEVICE

(71) Applicant: Infineon Technologies Austria AG, Villach (AT)

(72) Inventors: Hans Weber, Bayerisch Gmain (DE); Christian Fachmann, Fuernitz (AT); Franz Hirler, Isen (DE); Winfried Kaindl, Unterhaching (DE); Markus Rochel, Radebeul (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/588,003

(22) Filed: Sep. 30, 2019

(65) Prior Publication Data

US 2020/0105918 A1  Apr. 2, 2020

(30) Foreign Application Priority Data

Oct. 2, 2018 (DE) .......................... 102018124418.5
Oct. 12, 2018 (DE) .......................... 102018125340.0

(51) Int. Cl.

| | |
|---|---|
| *H01L 29/78* | (2006.01) |
| *H01L 21/265* | (2006.01) |
| *H01L 21/3105* | (2006.01) |
| *H01L 21/762* | (2006.01) |
| *H01L 21/765* | (2006.01) |
| *H01L 21/8234* | (2006.01) |
| *H01L 29/06* | (2006.01) |
| *H01L 29/40* | (2006.01) |

(52) U.S. Cl.
CPC ........ *H01L 29/7802* (2013.01); *H01L 21/265* (2013.01); *H01L 21/31053* (2013.01); *H01L 21/765* (2013.01); *H01L 21/76224* (2013.01); *H01L 21/823487* (2013.01); *H01L 29/0634* (2013.01); *H01L 29/402* (2013.01)

(58) Field of Classification Search
CPC .............. H01L 29/7802; H01L 21/265; H01L 21/31053; H01L 21/76224; H01L 21/765; H01L 21/823487; H01L 29/0634; H01L 29/402

See application file for complete search history.

(56) References Cited

U.S. PATENT DOCUMENTS

| | | | |
|---|---|---|---|
| 2008/0001223 A1* | 1/2008 | Saggio | ................ H01L 29/7811 257/341 |
| 2012/0122307 A1* | 5/2012 | Mizushima | ....... H01L 29/66143 438/570 |

(Continued)

FOREIGN PATENT DOCUMENTS

WO    2018029951 A1    2/2018

*Primary Examiner* — Fernando L Toledo
*Assistant Examiner* — Neil R Prasad
(74) *Attorney, Agent, or Firm* — Murphy, Bilak & Homiller, PLLC

(57) ABSTRACT

A method and a transistor device are disclosed. The method includes: forming a trench in a first surface in an edge region of a semiconductor body; forming an insulation layer in the trench and on the first surface of the semiconductor body; and planarizing the insulation layer so that a trench insulation layer that fills the trench remains, wherein forming the insulation layer comprises a thermal oxidation process.

23 Claims, 15 Drawing Sheets

(56) References Cited

U.S. PATENT DOCUMENTS

| | | | |
|---|---|---|---|
| 2013/0037852 A1* | 2/2013 | Tamaki | H01L 29/402 257/139 |
| 2016/0013267 A1* | 1/2016 | Lee | H01L 29/66734 257/495 |
| 2016/0020279 A1 | 1/2016 | Turner et al. | |
| 2016/0087034 A1 | 3/2016 | You et al. | |
| 2018/0012994 A1* | 1/2018 | Loechelt | H01L 29/66734 |
| 2018/0019132 A1 | 1/2018 | Mauder et al. | |
| 2018/0114830 A1 | 4/2018 | Griebl et al. | |

* cited by examiner

METHOD FOR FORMING AN INSULATION LAYER IN A SEMICONDUCTOR BODY AND TRANSISTOR DEVICE

BACKGROUND

This disclosure in general relates to a method for forming an insulation layer in a semiconductor body.

Insulation layers, such as thermal oxide layers, are an important feature in power semiconductor devices such as power MOSFETs (Metal Oxide Semiconductor Field Effect Transistors). For example, in an edge termination structure of a power semiconductor device an insulation layer may be used to isolate an electrically conducting field electrode from a semiconductor body. Forming such an insulation layer may include a thermal growth process in which the insulation layer is selectively grown on the surface of the semiconductor body, and/or a deposition process in which the insulation layer is deposited on a surface of the semiconductor body. However, depositing the insulation layer on the surface of the semiconductor body in the edge region produces a step between a surface of the insulation layer and the surface of the semiconductor body in an inner region, which is often referred to as active region and may include a plurality of transistor cells. The step caused by the insulation layer makes it difficult, if not impossible, to use planarization processes in the formation of the transistor cells.

There is therefore a need for an improved process for forming such an insulation layer.

SUMMARY

One example relates to a method. The method includes forming a trench in a first surface in an edge region of a semiconductor body, forming an insulation layer in the trench and on the first surface of the semiconductor body, and planarizing the insulation layer so that a trench insulation layer that fills the trench remains, wherein forming the insulation layer includes a thermal oxidation process.

Another example relates to a transistor device. The transistor device includes a plurality of superjunction transistor cells in an inner region of a semiconductor body, a trench insulation layer arranged in an edge region of the semiconductor body and extending in a vertical direction of the semiconductor body from a first surface of the semiconductor body into the semiconductor body.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings, the same reference characters denote like features.

DETAILED DESCRIPTION OF THE DRAWINGS

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1A:
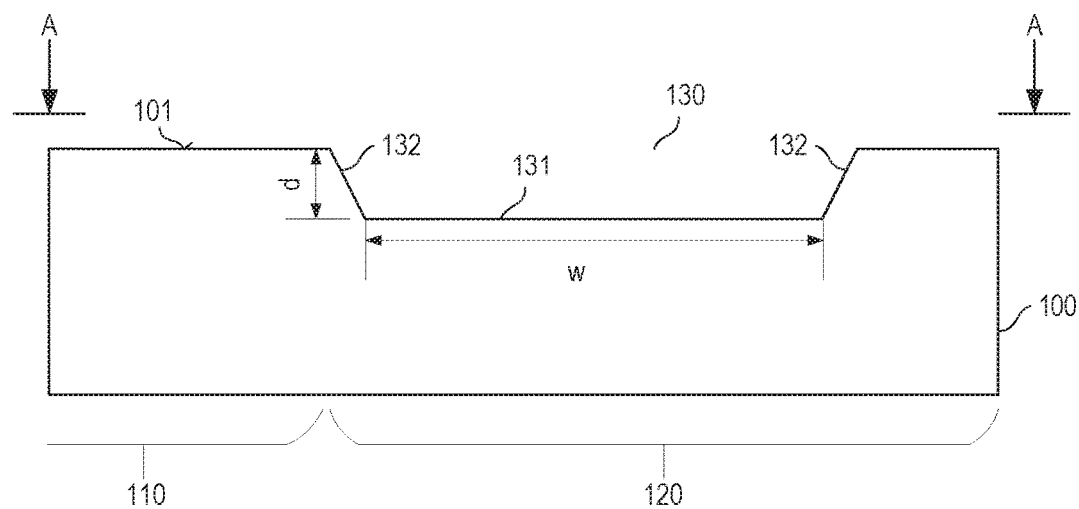
FIGS. 1A to 1C illustrate one example of a method for forming a trench insulation layer in a semiconductor body.
Figure 1B:
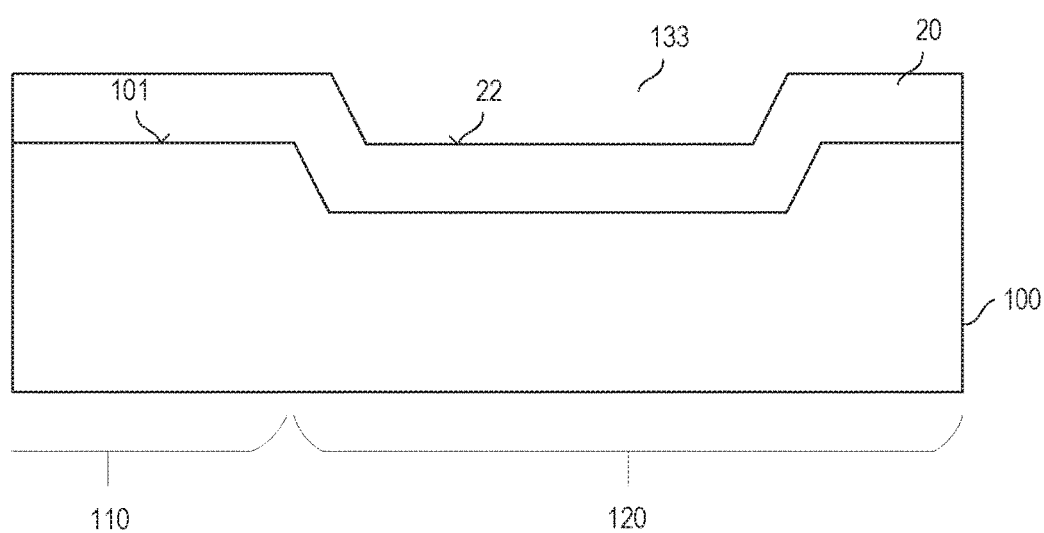
Figure 1C:
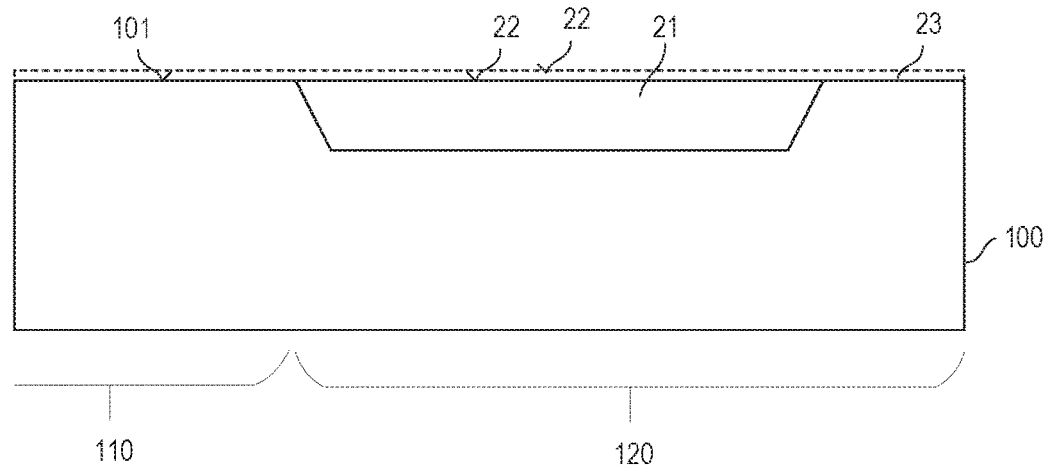

FIGS. 1A to 1C illustrate one example of a method for forming a trench insulation layer 21 in a trench 130 of a semiconductor body 100. Each of FIGS. 1A to 1C shows a vertical cross sectional view of one section of the semiconductor body 100 in which the trench insulation layer 21 is formed. The "vertical section plane" is a section plane perpendicular to a first surface 101 of the semiconductor body 100. According to one example, the semiconductor body 100 includes a monocrystalline semiconductor material. Examples of the semiconductor material include but are not restricted to, silicon (Si), silicon carbide (SiC), gallium nitride (GaN), gallium arsenide (GaAs), or the like.

Referring to FIG. 1A, the method includes forming the trench 130 in the first surface 101 of the semiconductor body 100. According to one example, the trench 130 is formed in an edge region 120 of the semiconductor body 100, wherein the edge region 120, in a horizontal plane of the semiconductor body 100, surrounds an inner region 110. This is illustrated in FIG. 2 which shows a top view of the semiconductor body 100 according to one example.

Figure 2:
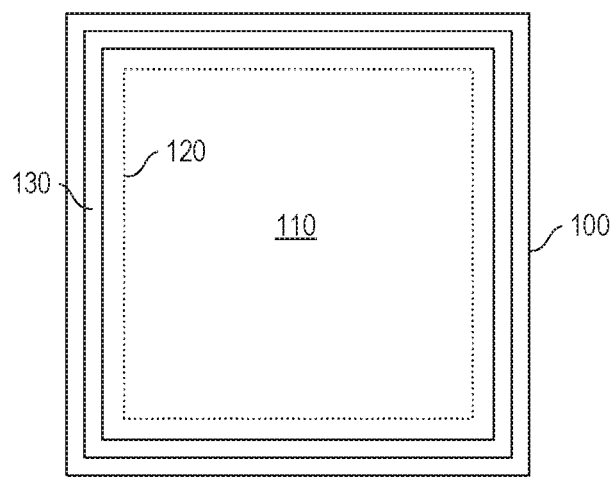
FIG. 2 illustrates a top view of the semiconductor body shown in FIG. 1A.

Referring to FIG. 2, the trench 130 may be formed such that the trench 130 surrounds the inner region 110. That is, the trench 130, in the first surface 101, forms a closed loop around the inner region 110. Just for the purpose of illustration, the closed loop formed by the trench 130 in the example shown in FIG. 2 is rectangular. This, however, is only an example. According to further examples (not shown) the closed loop 130 may be rectangular with rounded corners, polygonal, or the like. The semiconductor body 100 can be part of a transistor device. In this case, a gate pad (not shown) may be formed on top of the semiconductor body close to an edge surface of the semiconductor body 100, wherein the edge surface terminates the semiconductor body in lateral directions. In this case, the trench can be implemented such that the gate pad (which may be produced after the trench 130) is arranged between the trench and the edge surface. In other words, the gate pad is located outside the closed loop formed by the trench.

Referring to FIG. 1A, the trench 130 has a bottom 131 and sidewalls 132. According to one example, the trench 130 is formed such that the bottom 131 is essentially parallel to the first surface 101 of the semiconductor body 100. According to one example, the sidewalls 132 are essentially perpendicular to the first surface 101. According to another example, shown in FIG. 1A, the trench 130 is formed such that the sidewalls 132 are bevelled such that the trench 130 widens from the bottom 131 towards the first surface 101.

According to one example, a width w of the trench 130 is the shortest distance between the sidewalls 132 at the bottom 131 of the trench 130, and a depth d of the trench 130 is the shortest distance between the bottom 131 and a plane in which the first surface 101 is located. According to one example, an aspect ratio d:w, which is the ratio between the trench depth d and the trench width w is less than 1 (1:1), in particular less than 0.1 (1:10), less than 0.025 (1:40), or even less than 0.01 (1:100): According to one example, the trench 130 is formed such that the depth d is between 250 nanometers (nm) and 4 micrometers (μm), in particular between 500 nm and 2 μm. According to one example, the width w is between 40 micrometers and 250 micrometers.

Referring to FIG. 1B, the method further includes forming an insulation layer 20 in the trench 130 and on top of the first surface 101 of the semiconductor body 100. According to one example, the insulation layer 20 is formed such that the insulation layer 20 completely covers the first surface 101 of the semiconductor body 100 and the bottom 131 and the sidewalls 132 of the trench 130. According to one example, forming the insulation layer 20 includes a thermal oxidation process.

Referring to FIG. 1B the insulation layer 20 formed on the first surface 101 and in the trench 130 reproduces the trench 130. That is, the arrangement with the semiconductor body 100 and the insulation layer 20 includes a trench 133, wherein a position and a geometry of this trench 133 is defined by the former trench 130 in the semiconductor body 100.

Referring to FIG. 1C, the method further includes forming a trench insulation layer 21 based on the insulation layer 20 such that the insulation layer 20 is planarized and a resulting structure including the trench insulation layer 21 and the semiconductor body 100 has an essentially planar surface. This includes that the insulation layer 20 is at least partially removed from the first surface 101 and remains in the trench 130, wherein the section of the insulation layer 20 remaining in the trench 130 forms the trench insulation layer 21. In the example illustrated in FIG. 1C, the planar surface is formed by a surface 22 of the trench insulation layer 21 and the first surface 101 of the semiconductor body 100. That is, in this example, the insulation layer is completely removed from the first surface 101. This, however, is only an example.

According to another example (illustrated in dashed lines in FIG. 1C), a section 23 of the insulation layer 20 remains on top of the first surface 101. In this example, the section 23 remaining on the first surface 101 and the surface 22 of the trench insulation layer 21 form the planar surface. Thus, the surface 101 of the semiconductor body 100 and the surface 22 of the trench insulation layer are arranged in the same horizontal plane. According to another example, the insulation layer 23 on top of the first surface 101 is not part of the insulation layer 20 but is a further layer formed during the planarization process. Examples of this are explained herein further below.

Referring to FIGS. 1A to 1C the method includes three main process sequences: forming the trench 130 (see FIG. 1A); forming the insulation layer 20 in the trench 130 and on top of the first surface 101 (see FIG. 1B); and the planarization process (see FIG. 1C). More detailed examples of these main process sequences are explained in the following.

Figure 3:
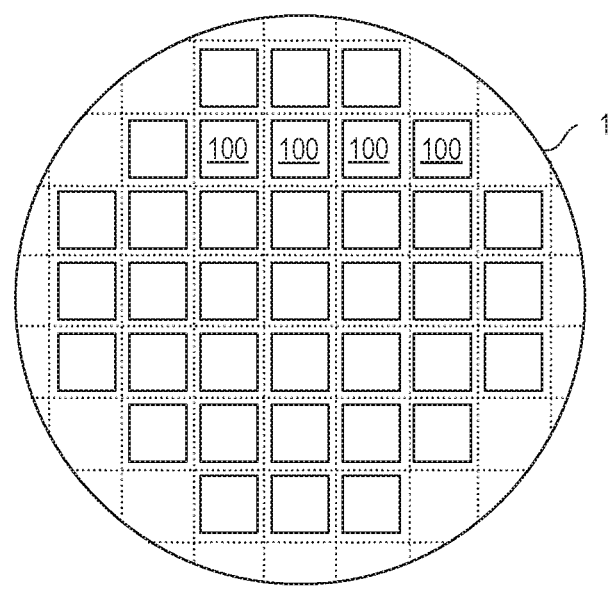
FIG. 3 illustrates a top view of a wafer including a plurality of semiconductor bodies.

Although FIGS. 1A to 1C show one section of one semiconductor body 100, it should be noted that the process steps illustrated in FIGS. 1A to 1C may be applied to a wafer that includes a plurality of semiconductor bodies. That is, these process steps may be performed when the semiconductor body 100 is part of a wafer, which may finally be cut into pieces in order to form a plurality of semiconductor bodies. FIG. 3 schematically illustrates a top view of a wafer 1 that includes a plurality of semiconductor bodies 100. Dotted lines in FIG. 3 illustrate those lines along which the wafer 1 can be separated in order to obtain the plurality of single semiconductor bodies 100 (which may also be referred to as semiconductor dies).

Figure 4A:
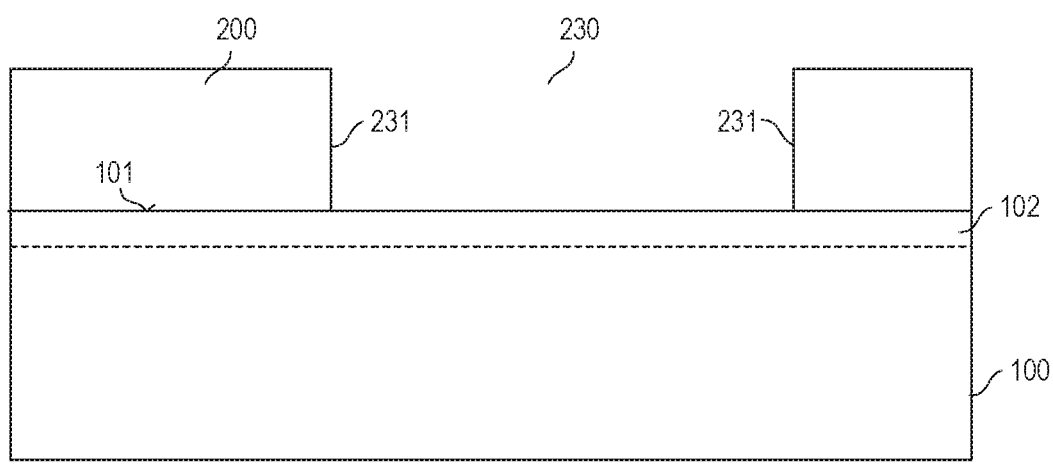
FIGS. 4A and 4B illustrate one example of a method for forming a trench in the semiconductor body.
Figure 4B:
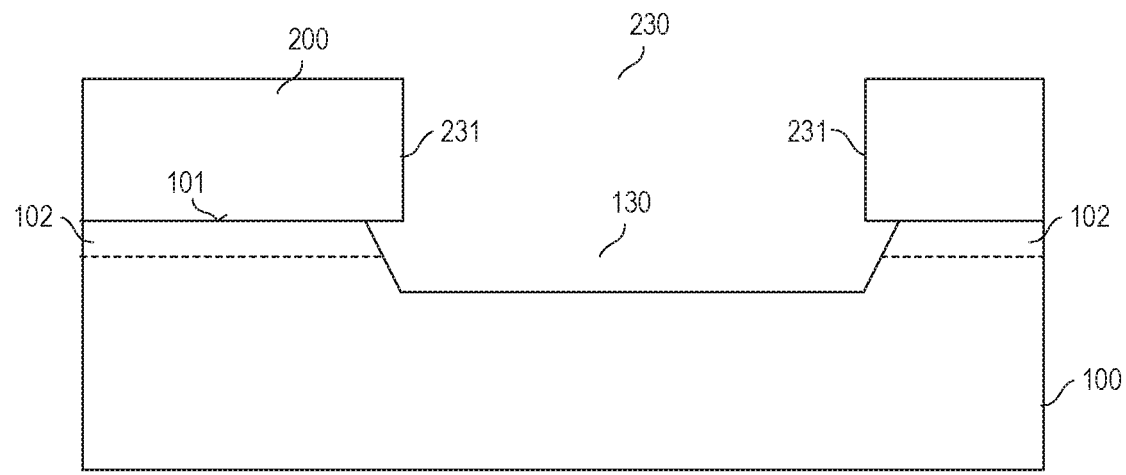

FIGS. 4A and 4B illustrate one example of a method for forming the trench 130. Each of FIGS. 4A and 4B shows a vertical cross sectional view of one section of the semiconductor body 100 in which the trench 130 is produced. Referring to FIG. 4A the method includes forming an etch mask 200 on top of the first surface 101 such that the etch mask 200 includes an opening 230. The opening 230 uncovers a section of the first surface 101 in which the trench 130 is to be produced.

Referring to FIG. 4B, forming the trench 130 further includes etching the semiconductor body 100 in those regions left uncovered by the opening 230. According to one example, the etching process is an isotropic etching process. In this case, the trench 130 may undercut the etch mask 200 along sidewalls 231 of the opening 230. Forming the trench 130 further includes removing the etch mask 200 in order to obtain a semiconductor structure as shown in FIG. 1A.

Figure 5:
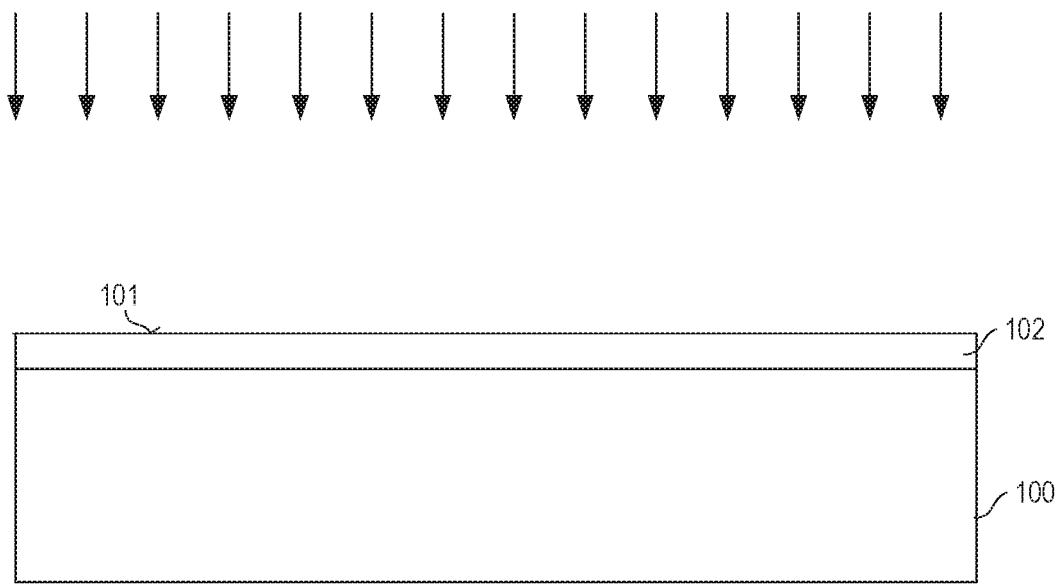
FIG. 5 illustrates an optional implantation process in the method illustrated in FIGS. 4A and 4B.

Optionally, the method illustrated in FIGS. 4A and 4B further includes a damage implantation process illustrated in FIG. 5 before forming the etch mask 200. In this implantation process damaging particles are implanted into the first surface 101 of the semiconductor body 100 to form a damaged region 102 along the first surface. This optional damaged region 102 is illustrated in dashed lines in FIGS. 4A and 4B. The damaging particles are noble gas ions, such as Argon (Ar) ions, for example. The implantation dose is selected from between 1E13 $cm^{-3}$ and 5E15 $cm^{-3}$, for example, and the implantation energy is selected from between 20 keV and 80 keV, for example.

In the etching process illustrated in FIGS. 4A and 4B, the damaged region 102 is etched faster than non-damaged regions of the semiconductor body 100. This enhances the formation of beveled sidewalk of the trench 130.

Figure 6:
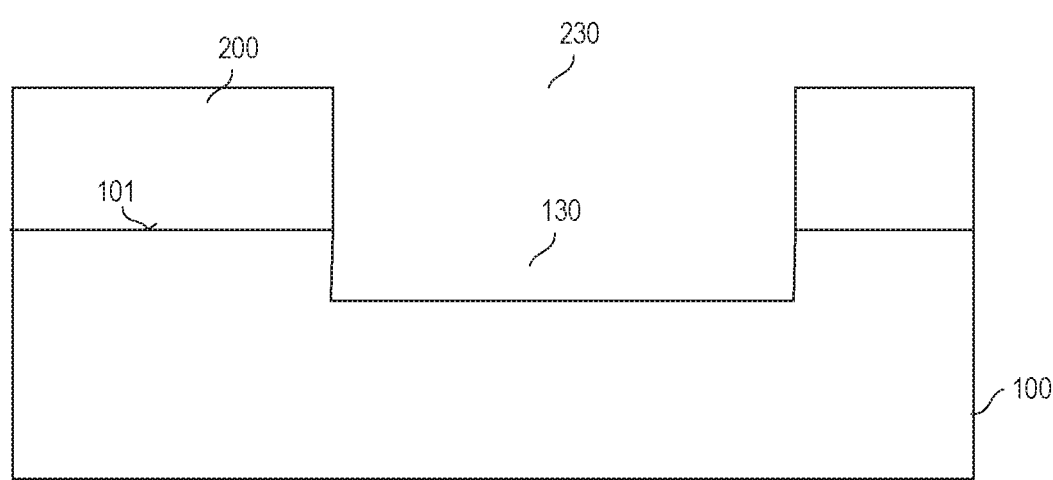
FIG. 6 illustrates another example of a method for forming a trench in the semiconductor body.

Referring to FIG. 4B, the etching process can be an isotropic etching process. According to another example shown in FIG. 6, the etching process can be an anisotropic etching process. In this example, the sidewalls 132 of the trench 130 are essentially perpendicular to the first surface 101.

Referring to the above, forming the insulation layer 20 may include a thermal oxidation process. According to one example, the insulation layer 20 is completely formed by a thermal oxidation process.

Figure 7:
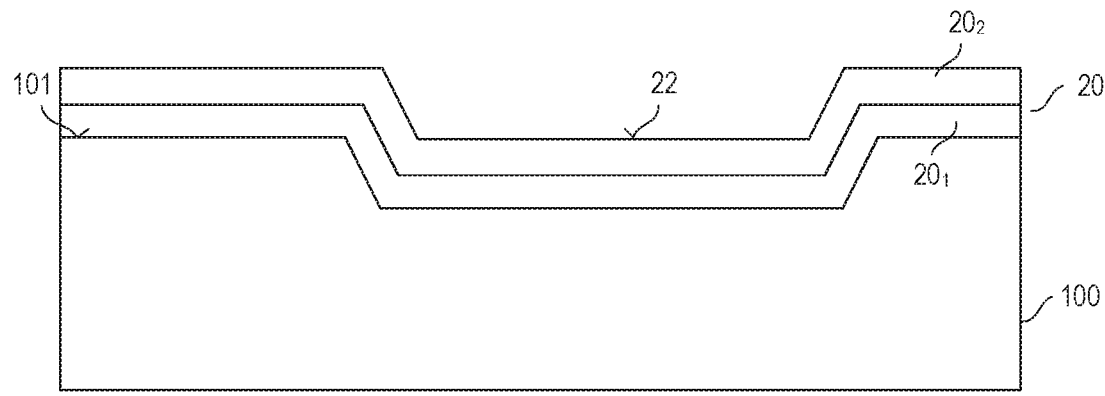
FIG. 7 illustrates one example of an insulation layer that includes two sublayers.

According to another example illustrated in FIG. 7, forming the insulation layer 20 includes forming a first sublayer 20$_1$ by a thermal oxidation process and forming a second sublayer 20$_2$ on top of the first sublayer 20$_1$ by a deposition process. Due to the nature of the thermal oxidation process, the first sublayer 20$_1$ is an oxide layer such as a silicon oxide (SiO$_2$) layer when the semiconductor body 100 is comprised of silicon. According to one example, the second sublayer 202 is an oxide layer of the same type as the first sublayer 20$_1$. A silicon oxide layer, for example, can be formed by a deposition process based on TEOS (tetraethoxysilane). According to one example, the first sublayer 20$_1$ is formed such that its thickness is between 200 nanometers (nm) and 1 micrometer (µm), in particular between 300 nanometers and 700 nanometers. Forming the first sublayer 20$_1$ includes a first temperature process in an oxidizing atmosphere. According to one example, a duration of this first temperature process is selected from between 20 minutes and 10 hours (600 minutes) and the temperature is selected from between 800° C. and 1250° C., in particular between 950° C. and 1150° C.

Referring to the explanation herein further below, forming an oxide layer by a thermal oxidation process "consumes" semiconductor material of the semiconductor body 100. According to one example, the first sublayer 20$_1$ is formed by a thermal oxidation process such that its thickness is less than twice the trench depth d. In particular, the thickness of the first sublayer may be between 0.2 times and 1.3 times the trench depth, more particularly between 0.3 times and 1.1 times the trench depth. Optionally, the method may further include a second temperature process after depositing the second sublayer 20$_2$, wherein this second temperature process may help to "compact" the deposited second layer 20$_2$.

Referring to the above, the insulation layer 20 is at least partially formed by a thermal oxidation process. A thermal oxide layer formed by this process "consumes" semiconductor material of the semiconductor body 100. Forming a thermal oxide layer with a certain thickness consumes a semiconductor layer along the first surface 101 that has about half the thickness of the thermal oxide layer. Forming a thermal oxide layer with a thickness of 600 nanometers, for example, consumes a semiconductor layer of about 300 nanometers. That is, the first surface 101 of the semiconductor body 100 before the thermal oxidation process is different from the first surface 101 of the semiconductor body 100 after the thermal oxidation process. In other words, a vertical position of the first surface 101 before the thermal oxidation process is different from a vertical position of an interface between the semiconductor body 100 and the thermal oxide layer after the thermal oxidation process. Nevertheless, in the following, "first surface 101" denotes the surface of the semiconductor body 100 before the thermal oxidation process and the surface of the semiconductor body 100 (the interface between the semiconductor body 100 and the thermal oxide layer) after the thermal oxidation process. Equivalently, "surface 22 of the trench insulation layer 21 before and after the planarization process, wherein in the planarization process a portion of the trench insulation layer 21 may be removed.

Figure 8:
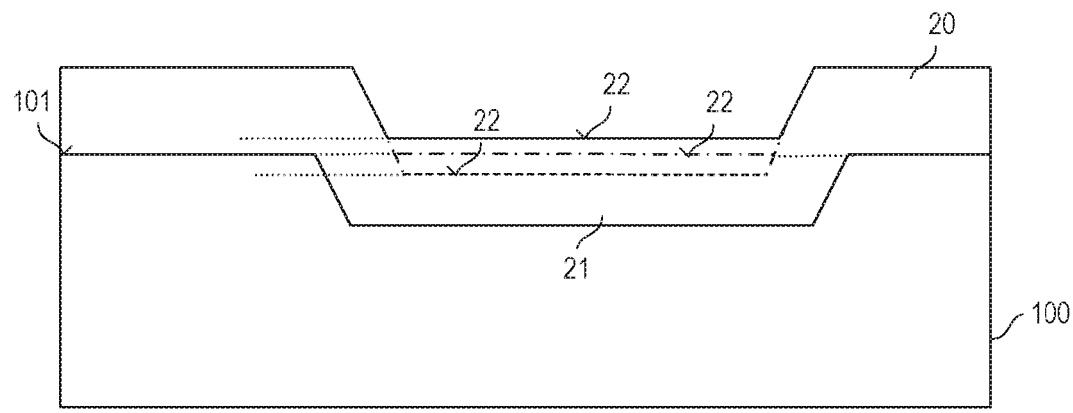
FIG. 8 illustrates different examples of a vertical position of a surface of the trench insulation layer relative to a vertical position of a first surface of the semiconductor body.

Referring to the above, the method includes a planarization process in which the insulation layer 20 is planarized in such a way that an essentially planar surface is formed. Dependent on where the vertical position of the first surface 101 of the semiconductor body 100 is located relative to the vertical position of the surface 22 of the trench insulation layer 21 before the planarization process, there are different scenarios as to which sections of the insulation layer 20 are removed in the planarization process, that is, when the planarization process may stop. This is explained with reference to FIG. 8 in the following. FIG. 8 illustrates different scenarios of how the vertical position of the first surface 101 and the vertical position of the surface 22 of the trench insulation layer 21 may be located relative to each other. In FIG. 8, three different vertical positions of the surface 22 of the trench insulation layer 21 relative to the first surface 101 are illustrated.

In a first scenario, which is illustrated by a solid line, the vertical position of the surface 22 of the trench insulation layer 21 is spaced apart from the first surface 101 of the semiconductor body 100 in a direction facing away from the first surface 101 so that the surface 22 of the trench insulation layer 21 is above the first surface 101. In a second scenario, which is illustrated by a dashed-and-dotted line, the vertical position of the surface 22 of the trench insulation layer 21 essentially equals the vertical position of the first surface 101. In a third scenario, which is illustrated by a dashed line, the vertical position of the surface 22 of the trench insulation layer 21 is spaced apart from the vertical position of the first surface 101 in a direction facing from the first surface 101 into the semiconductor body 100, so that the surface 2.2 of the trench insulation layer 21 is below the first surface 101 of the semiconductor body 100. The position of the surface 22 of the trench insulation layer relative to the position of the first surface 101 can be adjusted by suitably adjusting the depth of the trench 130 and the thickness of the insulation layer 20 and taking into account the "consumption" of a semiconductor layer along the first surface 101 in the thermal oxidation process.

In the first scenario, the planarization process can be such that material of the insulation layer 20 is removed from above the first surface 101 such that a portion of the insulation layer remains on the first surface 101 and that the remaining portion and the trench insulation layer 21 form an essentially planar surface. Optionally, the insulation layer 20 is completely removed from above the first surface 101. In this case, the trench insulation layer 21 is partially removed so that the surface 22 of the trench insulation layer 21 and the first surface 101 of the semiconductor body 100 form an essentially planar surface.

In the second scenario, the insulation layer 20 is completely removed from above the first surface 101. In this case, the surface 22 of the trench insulation layer 21 and the first surface 101 of the semiconductor body 100 form an essentially planar surface.

In the third scenario, the planarization process can be such that it completely removes the insulation layer 20 from above the first surface 101 and removes a portion of the semiconductor body along the first surface 101. In this case, the surface 22 of the trench insulation layer 21 and the first surface 101 of the semiconductor body 100 form an essentially planar surface.

This planarization process may include an etching process, a polishing process or combinations thereof. According to one example, the planarization process includes a polishing process, only. The polishing process, based on the structure shown in FIG. 1B, abrades material of the insulation layer 20 and, optionally, material of the semiconductor body 100 until a planar surface is obtained. According to one example, the polishing process includes a CMP (chemical-mechanical polishing) process. The polishing process may stop as soon as a planar surface has been obtained. Further examples of the planarization process are explained in the following.

Figure 9A:
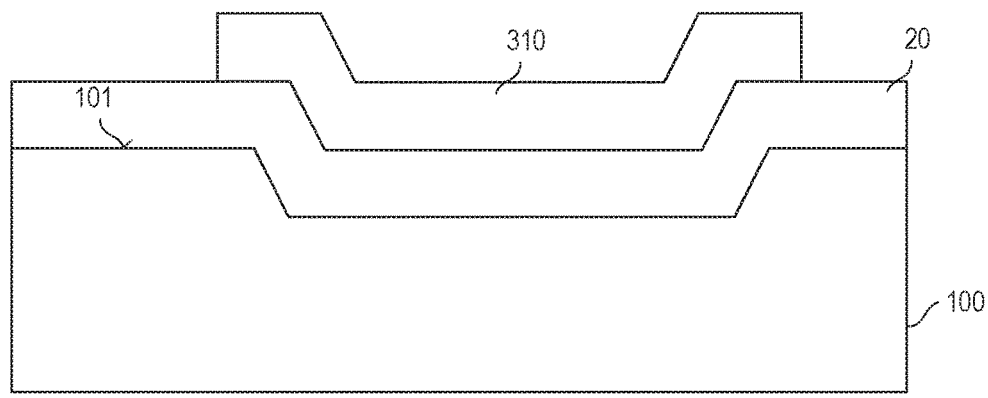
FIGS. 9A to 9D illustrate one example of a planarization process.

In the example illustrated in FIGS. 9A to 9D, the planarization process includes forming an etch mask 310 on top of the trench insulation layer 21. According to one example, as illustrated in FIG. 9A, the etch mask 310 is formed such that it overlaps sections of the insulation layer 20 formed on top of the first surface 101.

Figure 9B:
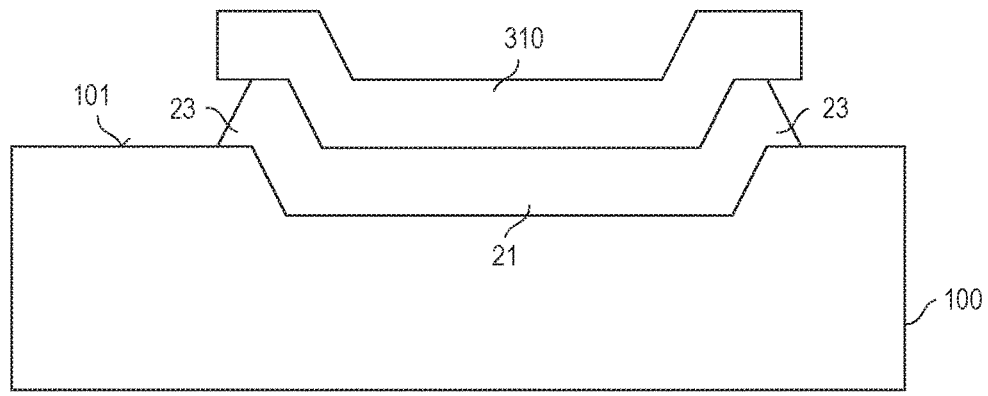

Referring to FIG. 9B, the method further includes an etching process in which those sections of the insulation layer 20 not covered by the etch mask 310 are removed. According to one example, the etching process is an isotropic etching process so that the etch mask 310 may be undercut, that is, sections of the insulation layer 20 below the etch mask 310 may be removed. After the etching process, the trench insulation layer 21 and residuals 23 of the insulation layer 20 on top of the first surface 101 remain.

Figure 9C:
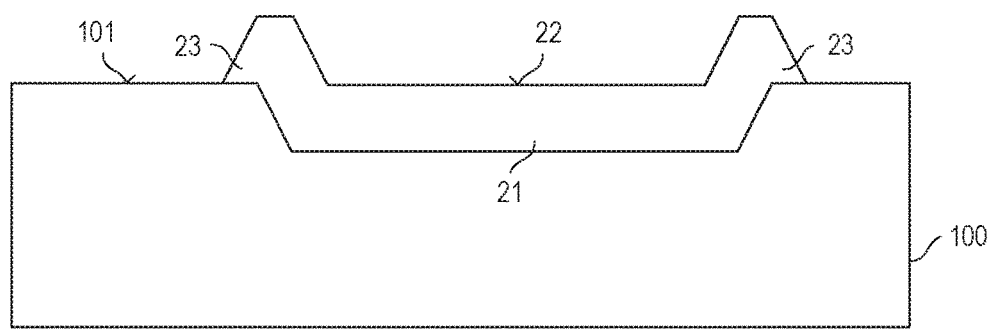
Figure 9D:
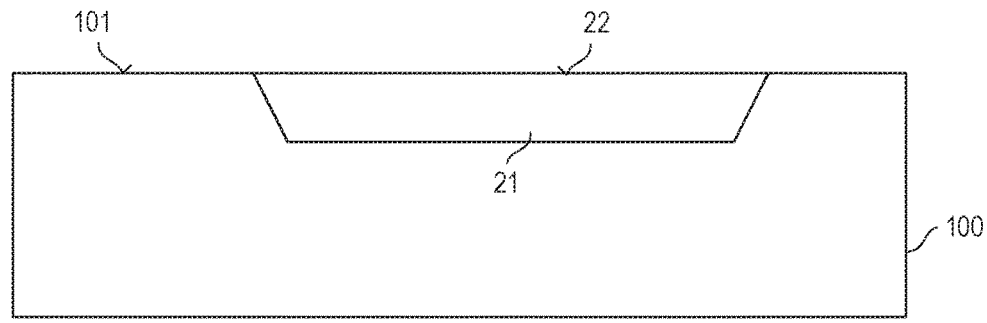

Referring to FIGS. 9C and 9D, the method further includes removing the etch mask 310 and a polishing process which at least removes the residuals 23. The polishing process may include a CMP process.

In the example illustrated in FIG. 9C, the first surface 101 of the semiconductor body 100 and the surface 22 of the trench insulation layer 21 form the planar surface. Dependent on which of the three scenarios explained with reference to FIG. 8 applies, there are different scenarios of when the polishing process may stop. In the first scenario, the polishing process stops when the residuals 23 have been removed down to the first surface 101 of the semiconductor body 100 and when a portion of the trench insulation layer 21 has been removed such that the surface 22 of the trench insulation layer 21 and the first surface 101 form a planar surface. In the second scenario, the polishing process stops when the residuals 23 have been removed down to the first surface 101. In the third scenario, the polishing process stops when the residuals 23 have been removed and a portion of the semiconductor body 100 has been removed such that the surface 22 of the trench insulation layer 21 and the first surface 101 form a planar surface.

Figure 10A:
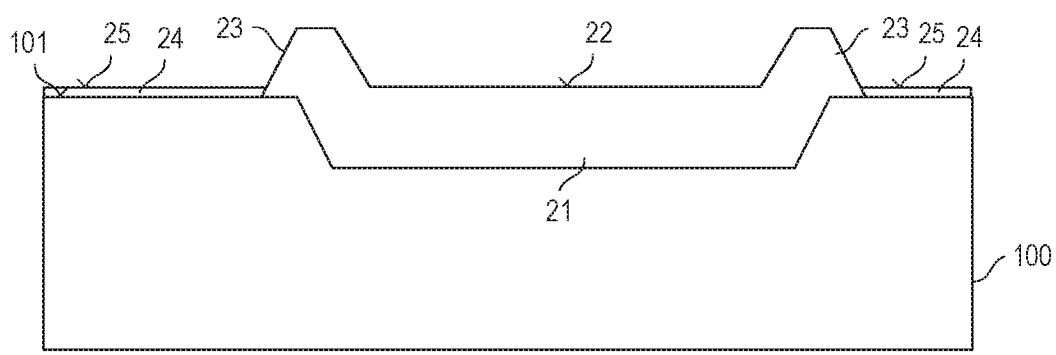
FIGS. 10A and 10B illustrate a modification of the method shown in FIGS. 9A to 9D.
Figure 10B:
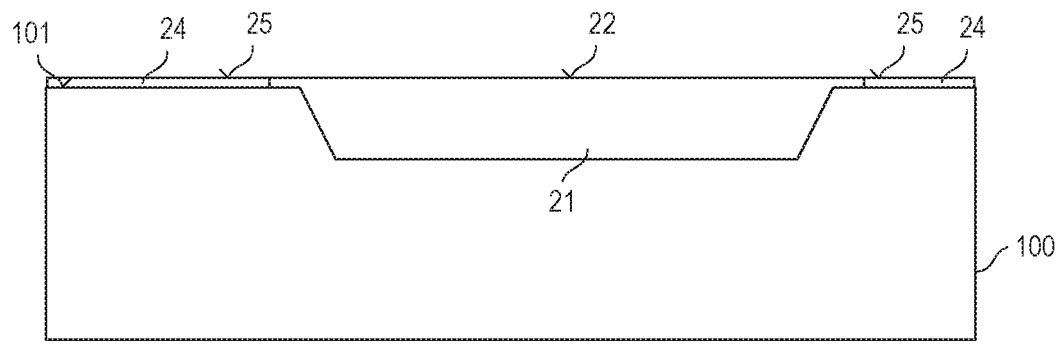

In the first scenario, the semiconductor body 100 may act as a stop layer of the polishing process. In the polishing process, an electric polishing tool with a polishing pad may be used, wherein a power consumption of a polishing tool may increase as the residuals 23 have been removed and the polishing pad reaches the surface of the semiconductor body. According to one example, the power consumption is monitored and the polishing process stops as the power consumption reaches a predefined threshold. Additionally to the polishing pad, the polishing process may use a slurry that includes a liquid with abrasive particles in the liquid FIGS. 10A and 10B illustrate a modification of the method illustrated in FIG. 9A to 9D. Referring to FIG. 10A, this method includes a further oxidation process after the etch mask 310 has been removed (as illustrated in FIG. 10A) or before the etch mask 310 is removed. This thermal oxidation process causes a further oxide layer 24 to grow on uncovered sections of the first surface 101 of the semiconductor body 100.

FIG. 10B shows the structure shown in FIG. 10A after the polishing process. In this example, the polishing process is controlled such that the polishing process stops when the residuals 23 and the trench insulation layer 21 have been planarized down to a surface 25 of the further oxide layer 24. In this example, the surface 25 of the further oxide layer 24 and the surface 22 of the trench insulation layer 21 form the planar surface. The trench insulation layer 21 may be formed such that its surface 22 has a vertical position that is equal to the vertical position of the surface 25 of the further oxide layer 24. In this case, the polishing process only planarizes (erodes) the residuals 23. According to another example, the trench insulation layer 21 is formed such that, before the polishing process, its surface 22 has a vertical position that is above a vertical position of the surface 25 of the further oxide layer 24. In this example, the polishing process also removes a portion of the trench insulation layer 21. In each of these processes, the further oxide layer 24 acts as a stop layer of the polishing process and protects the semiconductor body from damages that may occur in the polishing process.

Figure 11A:
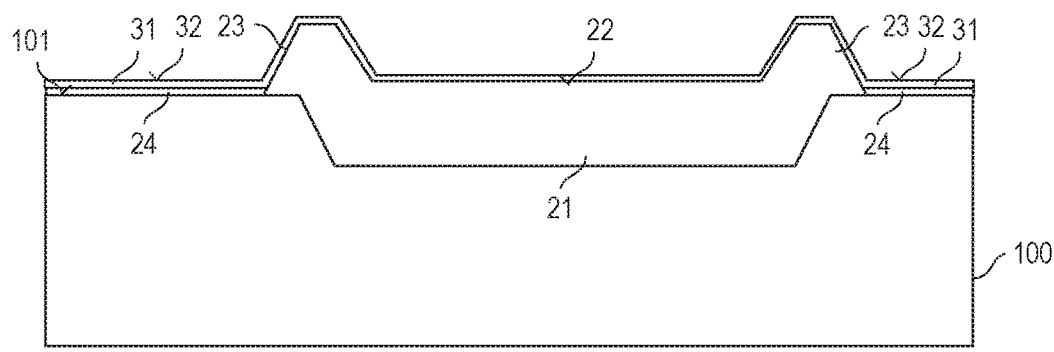
FIGS. 11A to 11C illustrate a modification of the method shown in FIGS. 10A an 10B.

FIG. 11A shows a modification of the method illustrated in FIGS. 10A and 10B. Referring to FIG. 11A, this method includes forming a nitride layer 31 on top of the further oxide layer 24 and on top of the residuals 23 and the trench insulation layer 21. The insulation layer 20 is formed such in this example that a vertical position of the surface 22 of the trench insulation layer 21 is above or equal to a vertical position of a surface 32 of those sections of the nitride layer 31 that cover the further oxide layer 24.

Figure 11B:
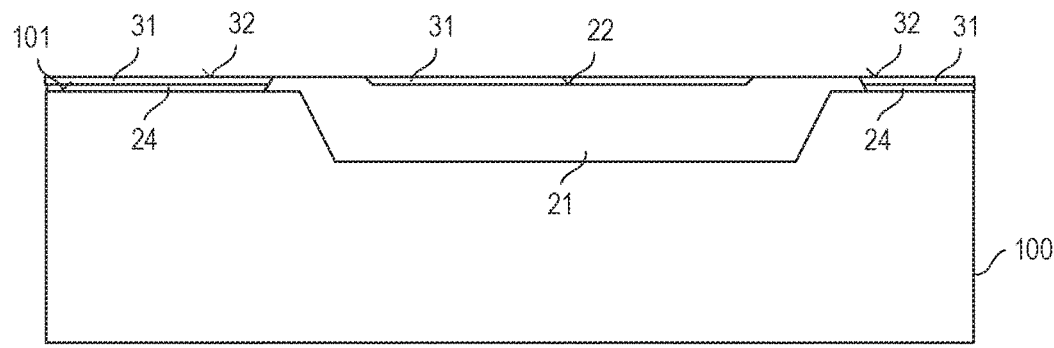

Referring to FIG. 11B, the method further includes a polishing process. According to one example, the polishing process is performed such that the nitride layer 31 acts as a stop layer of the polishing process. That is, the residuals 23 and the trench insulation layer 21 are planarized until the surface 22 of the trench insulation layer 21 and the surface 32 of the nitride layer 31 for an essentially planar surface.

Figure 11C:
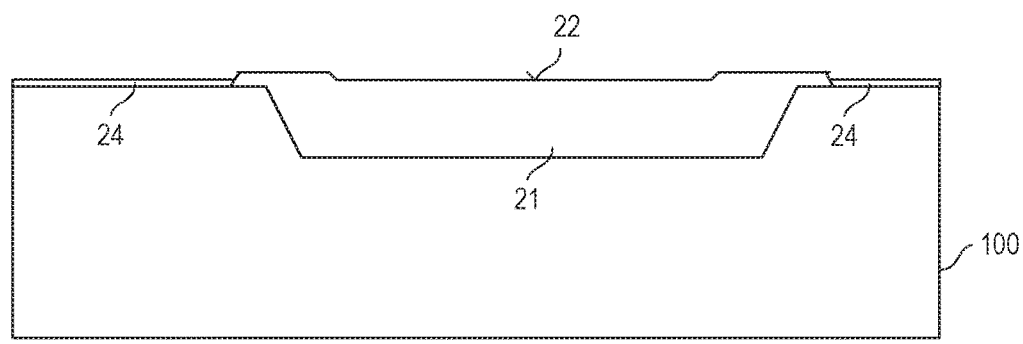

Referring to FIG. 11C, the method further includes removing the nitride layer 31. The overall surface may be slightly uneven after this process. This, however, is either acceptable or can be eliminated by an etching process that etches the surface of the insulation layer 21.

Figure 12A:
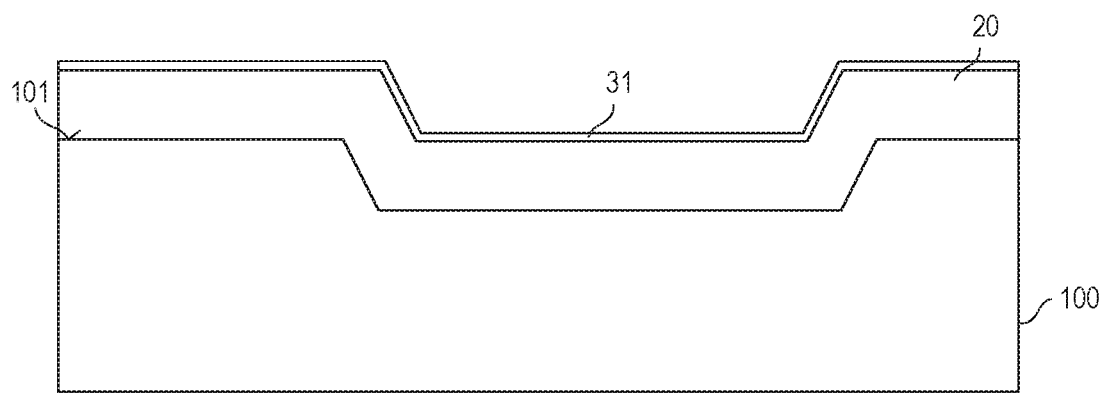
FIGS. 12A to 12C illustrate a further modification of the method shown in FIGS. 9A to 9D.
Figure 12B:
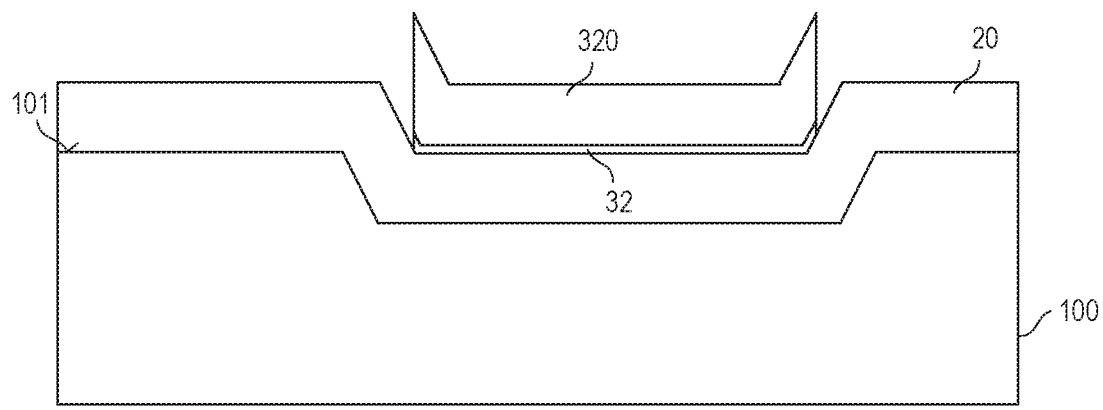
Figure 12C:
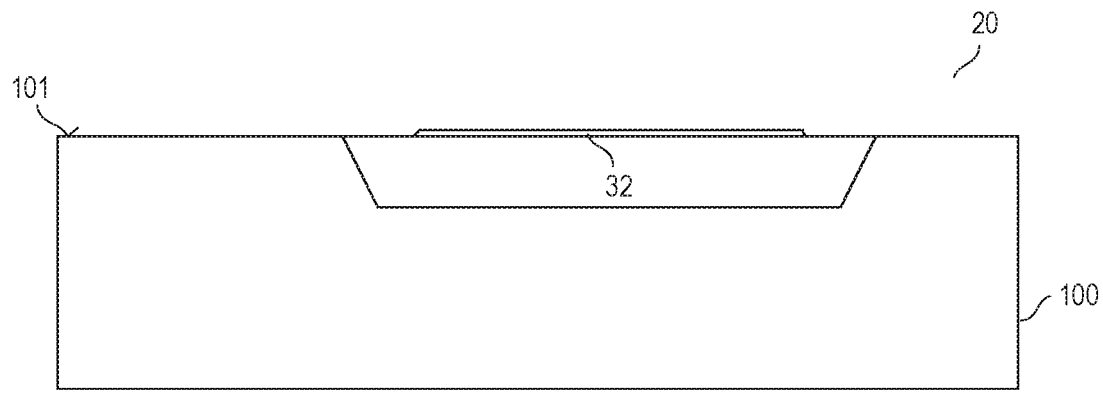

FIGS. 12A to 12C illustrate a further modification of the method shown in FIG. 9A to 9D. Referring to FIG. 12A, this method includes forming a nitride layer 31 on the insulation layer 20, forming an etch mask 320 on the nitride layer 31 on top of the trench insulation layer 21, and removing those sections of the nitride layer 31 not covered by the etch mask 320. Referring to FIG. 12C the method further includes a polishing process in which the nitride layer 32 on top of the trench insulation layer 21 acts as a stop layer.

Figure 13A:
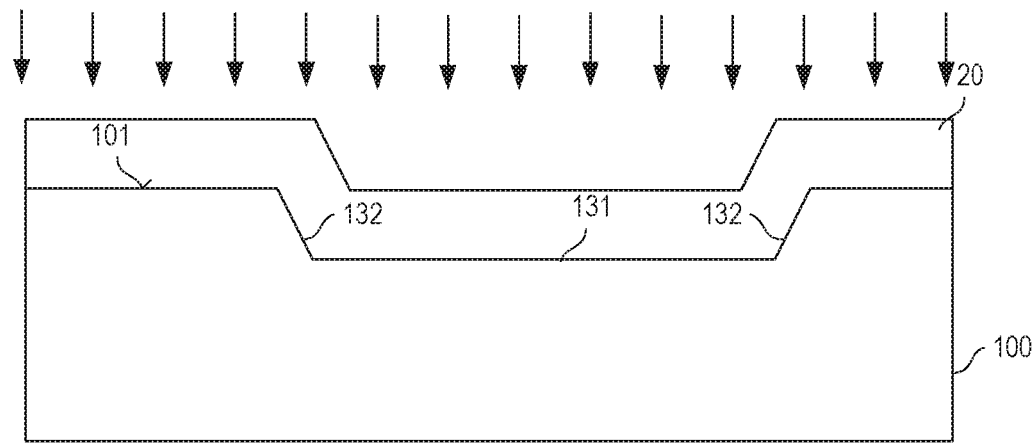
FIGS. 13A to 13C illustrate yet another a further modification of the method shown in FIGS. 9A to 9D.
Figure 13B:
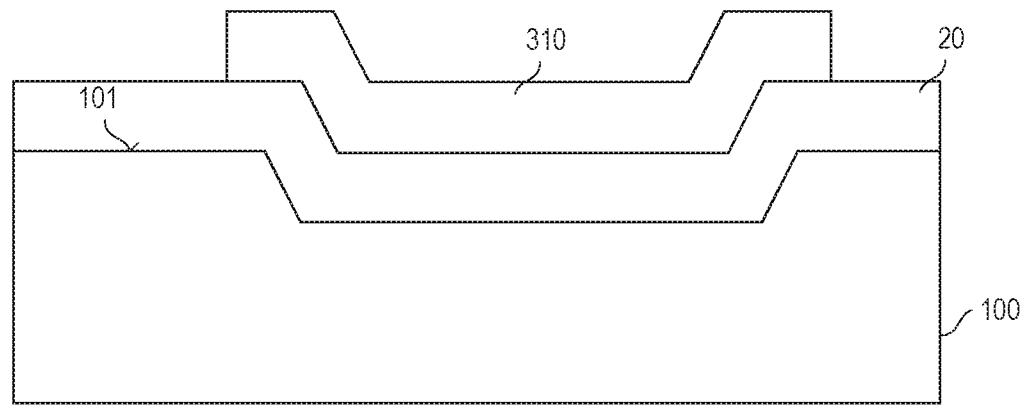
Figure 13C:
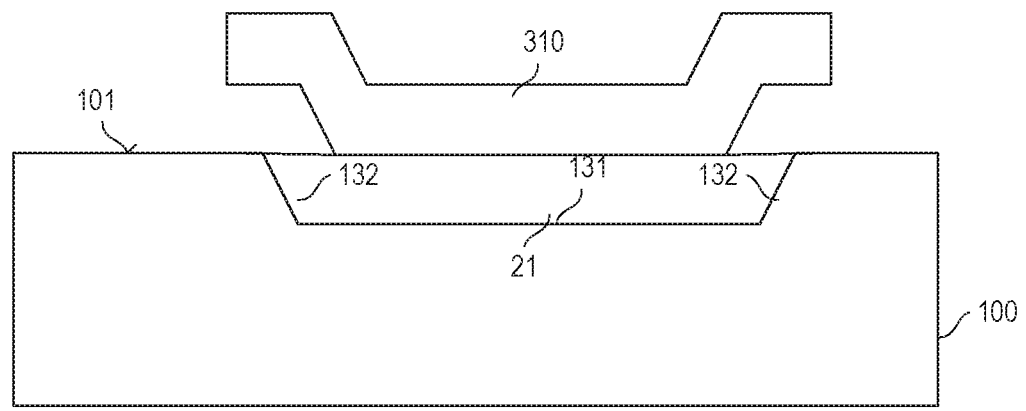

Another modification of the method illustrated in FIGS. 9A to 9D is illustrated in FIGS. 13A to 13C. The method illustrated in FIGS. 13A to 13C is different from the method illustrated in FIGS. 9A to 9D in that a damage implantation process takes place before forming the etch mask 310.

FIG. 13A shows the arrangement with the semiconductor body 100 and the insulation layer 20 during the damage implantation process. In this process, those regions of the insulation layer that adjoin its surface are damaged. How deep the damaged regions reach into the insulation layer 20 is dependent on an implantation energy in the damage implantation process. Basically, the higher the implantation energy the deeper the damaged region reaches into the insulation region 20. Referring to FIG. 13A, damaging particles are implanted in the insulation layer 20 in a direction that is essentially perpendicular to the surface 101 of the semiconductor body 100. According to one example, the implantation energy is selected such that the damaging particles do not go through the insulation layer 20 in those sections of the insulation layer 20 that cover the first surface

101 and the bottom of the trench. In this case, a non-damaged region of the insulation layer 20 remains at least along the trench sidewalls where, in the implantation direction, the insulation layer 20 is thicker than above the first surface 101 and the bottom 131.

Referring to FIG. 13B, a protection layer 310 is formed on those sections of the insulation layer 20 that cover the bottom 131 and the sidewalls 132 of the trenches. Further, the protection layer 310, in the lateral direction, slightly extends beyond the sections of the insulation layer 20 covering the sidewalls 132.

Figure 14:
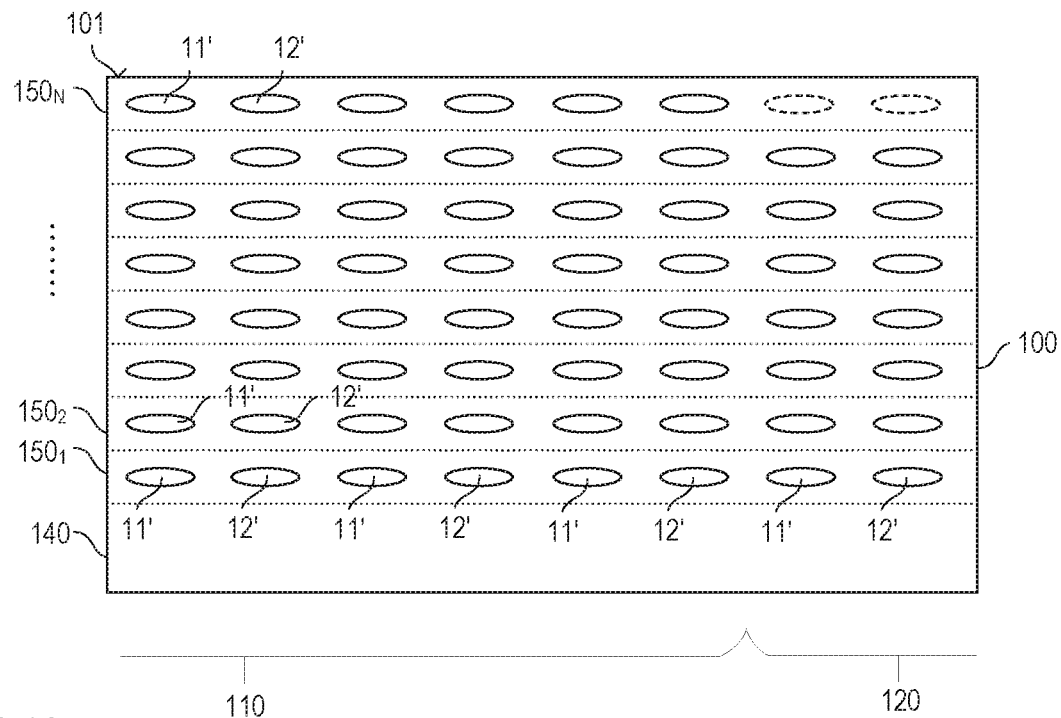
FIG. 14 illustrates forming implanted regions in a semiconductor body according to one example.

The method illustrated in FIGS. 13A to 13B further includes an etching process such as an isotropic etching process. In this process, damaged regions of the insulation layer 20 are etched faster than non-damaged regions. The protection layer 310 widely protects those sections of the insulation layer 20 it covers from being etched. In an isotropic etching process, however, the protection layer 310 is undercut so that the insulation layer 20 is removed below edges of the protection layer 310. According to one example, a duration of the etching process is such that the process stops when the insulation layer 20 has been removed from on top of the surface 101. In this case, etching the non-damaged regions of the insulation layer 20 that cover the sidewalls 132 can essentially prevented so that after the etching process the insulating layer 20 has been removed from the surface 101 but still fills the trench. According to one example, a polishing process is not required in this process. According to one example, the trench insulation layer 21 is part of an edge termination structure of a superjunction transistor device. Referring to FIG. 14, forming a superjunction transistor device includes forming a plurality of first implanted regions 11' one above the other in the semiconductor body 100 and forming a plurality of second implanted regions 12' one above the other in the semiconductor body 100. The first implanted regions 11' include dopant atoms of a first doping type, and the second implanted regions include dopant atoms of a second doping type complementary to the first doping type. Referring to FIG. 14, a plurality of structures each including a plurality of first implanted regions 11' and a plurality of structures each including a plurality of second implanted regions 12' may be formed in the semiconductor body 100. Forming these first and second implanted regions 11', 12' may include forming a plurality of epitaxial layers 150₁-150ₙ one on top of the other on a semiconductor substrate 140 and implanting dopant atoms of the first doping type and the second doping type using a respective implantation mask into each of the plurality of epitaxial layer 150₁-150ₙ. This type of process, which is usually referred to as multi-epitaxial-multi-implantation (MEMI) process is commonly known so that no further explanations are required in this regard.

The semiconductor body 100 shown in FIGS. 14 that includes a plurality of epitaxial layers 150₁-150ₙ formed one above the other is a monocrystalline semiconductor body 100. That is, there are no visible borders or interfaces between the individual epitaxial layers 1501-150N. Nevertheless, for illustration purposes, the individual epitaxial layers 150₁-150ₙ are illustrated in dotted lines in FIGS. 14.

Figure 16:
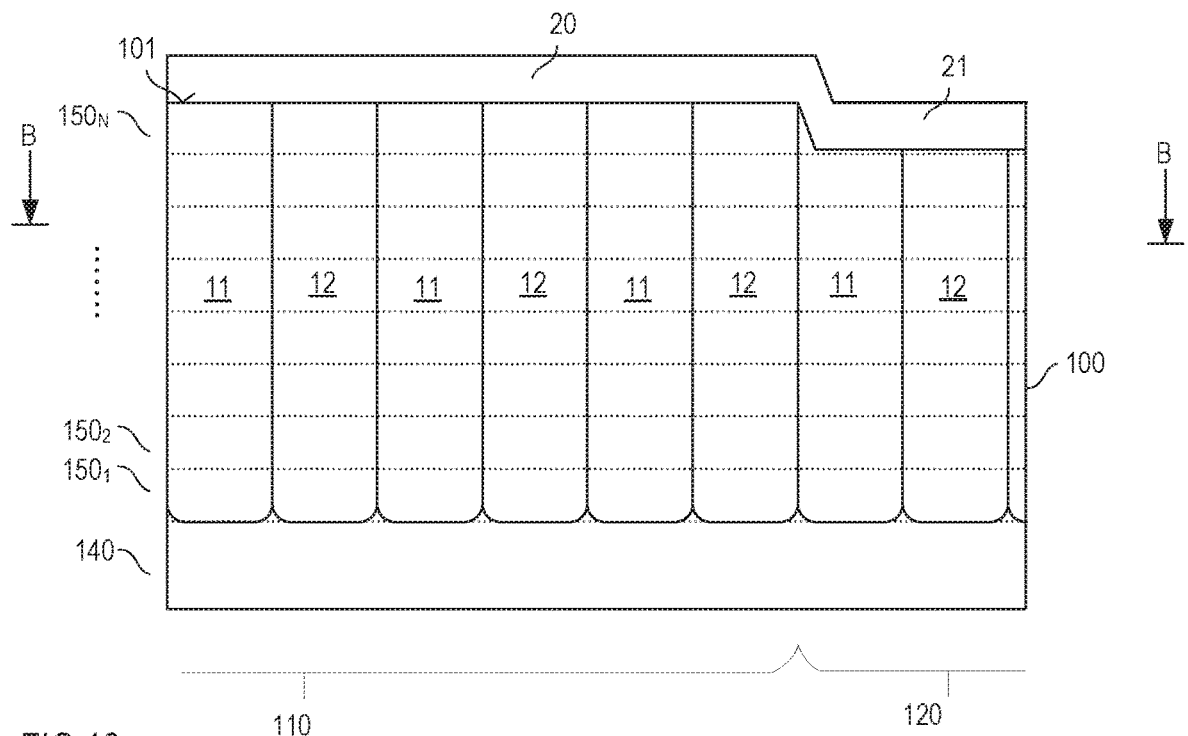
FIG. 16 shows the semiconductor body according to one of FIGS. 14 and 15 after forming a trench insulation layer.

Referring to the above, the first and second implanted regions 11', 12' can be formed by an MEMI process. According to another example, forming the first and second implanted regions 11', 12' may include forming trenches in each of the epitaxial layers 150₁-150ₙ and implanting first type dopant atoms into first sidewalls and second type dopant atoms into second sidewalls of these trenches in order to obtain the first and second implanted regions 11', 12'. A vertical cross sectional view of a semiconductor body 100 that includes a plurality of first and second implanted regions that have been formed in this way is illustrated in FIG. 16. According to one example, the first type dopant atoms include one of arsenic (As) atoms and antimony (Sb) atoms and the second type dopant atoms include boron (B) atoms, which diffuse faster than As or Sb atoms. As and Sb is an n-type dopant in a silicon semiconductor body and B is a p-type dopant in a silicon semiconductor body.

The first and second implanted regions 11', 12' are formed in the semiconductor body 100 before forming the trench 130 in the edge region 120 and the insulation layer 20 in the trench 130 and on top of the first surface 101. FIG. 16 shows the semiconductor body 100 according to one of FIGS. 14 and 15 after forming the trench 130 in the edge region 120 and forming the insulation layer 20, that is, after performing the method steps explained with reference to FIGS. 1A and 1B. In FIG. 16 only a section of the edge region 120 is shown so that only a section of the trench 130 and the trench insulation layer 21 are illustrated.

Referring to the above, forming the trench insulation layer 20 includes a thermal oxidation process. In the example illustrated in FIGS. 14 and 15, this oxidation process is not only used to form the insulation layer 20, but it is also used to diffuse and activate the first type dopant atoms included in the first implanted regions 11' and the second type dopant atoms included in the second implanted regions 12' in order to form a plurality of first regions 11 of a first doping type and second regions 12 of a second doping type, wherein each of these first and second regions 11, 12 extends in the vertical direction of the semiconductor body 100.

Figure 15:
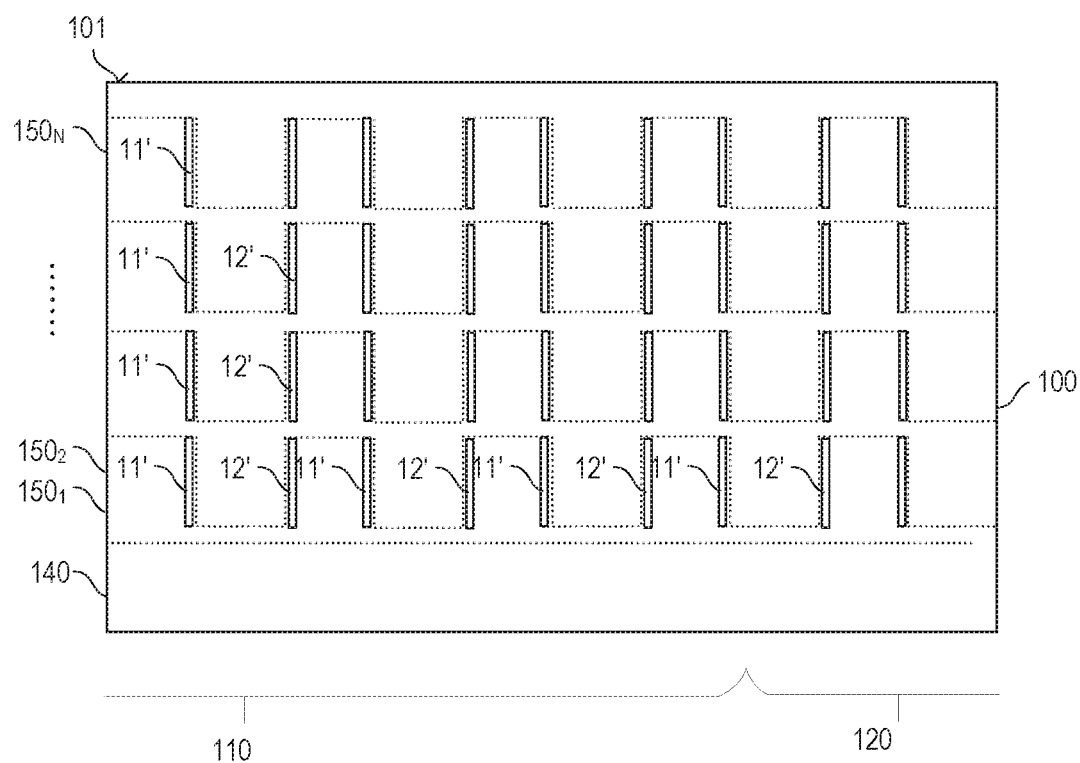
FIG. 15 illustrates a modification of the method shown in FIG. 14.

The method explained with reference to FIG. 15 can be modified in that both first type dopant atoms and second type dopant atoms are implanted into each of the first and second sidewalls. In this example, first time dopant atoms and second type dopant atoms with different diffusion coefficients are used in order to achieve, at the end of the thermal oxidation process, first regions 11 and second regions 12 as illustrated in FIG. 16.

The growth of at least one portion of the insulation layer 20 in the thermal oxidation process is associated with the generation of interstitials at an interface between the insulation layer 20 and the semiconductor body 100. These interstitials rapidly diffuse in the semiconductor body 100 and may promote the diffusion of one type of dopant atoms. Interstitials, for example, promote the diffusion of boron (B) atoms, while at the same time they impede the diffusion of arsenic (As) or antimony (Sb). This may help to form first regions 11 and second regions 12 that are separated from each other in particular in those cases in which first type dopant atoms and second type dopant atoms are implanted into the same sidewalls of trenches in the epitaxial layers 150₁-I 50ₙ. Implantation of first type dopant atoms and second type dopant atoms into the same sidewalls may include two implantation processes, one for each dopant type, or may include one implantation process in which molecules that include dopant atoms of both the first type and the second type are implanted. According to one example, the oxidation takes place in a wet oxidation environment, in the presence of water vapor, for example. According to another example, the oxidation takes place in a dry oxidation environment.

In the example shown in FIG. 16, a sidewall of the trench in which the trench insulation layer 21 is arranged is located in one of the first regions 11. This, however, is only an example. According to another example (not illustrated) the sidewall is located in one of the second regions 12 or crosses a pn junction between a first region 11 and a second region 12.

Figure 17:
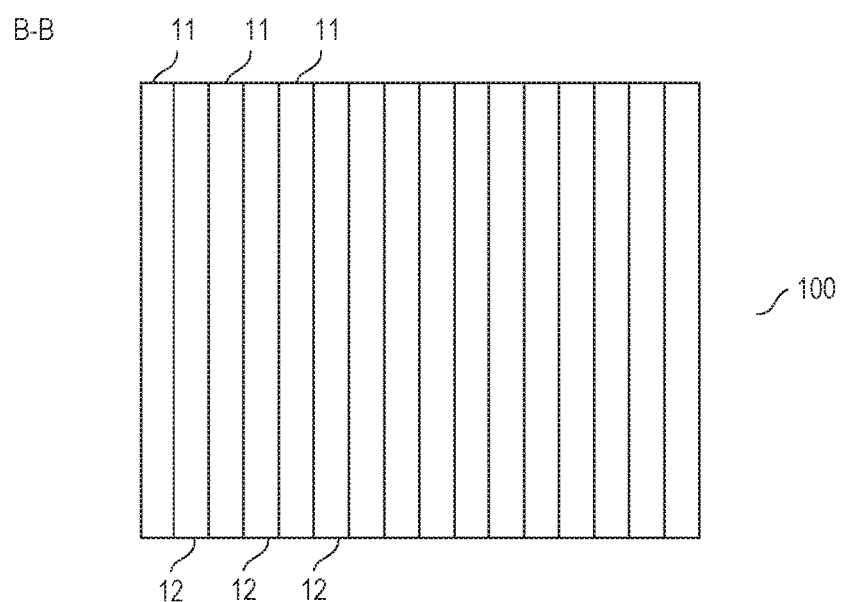
FIG. 17 shows a horizontal cross sectional view of the semiconductor body shown in FIG. 16.

FIG. 17 shows a horizontal cross-sectional view of the semiconductor 100 shown in FIG. 16. Referring to this example, the first and second regions 11, 12 can be formed such that they are elongated regions in horizontal direction of the semiconductor body 100. The "horizontal direction" is a direction parallel to the first surface 101.

Figure 18:
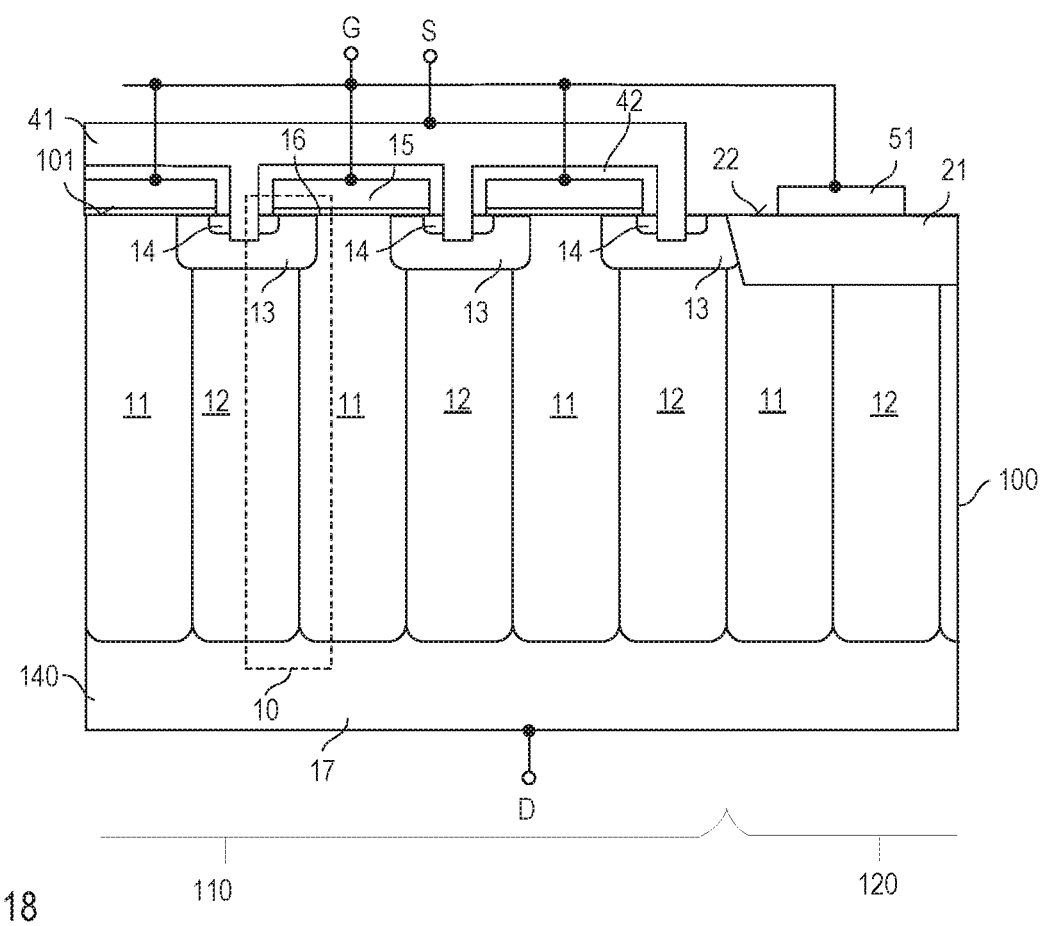
FIG. 18 shows a vertical cross sectional view of a superjunction transistor device according to one example.

FIG. 18 shows a vertical cross-sectional view of a superjunction transistor device that is based on a structure as illustrated in FIG. 16. Forming this superjunction transistor device includes any of the planarization processes explained herein before in order to obtain the planarized surface, and forming a plurality of transistor cells. Each of the plurality of transistor cells includes a body region 13 of the second doping type, a source region 14 of the first doping type embedded in the body region 13, and a gate electrode 15 adjacent the body region 13 and dielectrically insulated from the body region 13 by a gate dielectric 16. Each of the body regions 13 may adjoin one of the second regions 12 and at least one of the first regions 11. The individual transistor cells are connected in parallel in that the gate electrodes 15 of the individual transistor cell are connected to a gate node G and that the source and body regions 14, 13 of the individual transistor cells are connected to a common source electrode 41, wherein the source electrode 41 is connected to a source node S or forms a source node S of the transistor device. A drain region 17 of the transistor device is formed by the semiconductor substrate 140 in this example. According to one example, the substrate 140 has the first doping type.

Referring to FIGS. 10A and 10B and 11A to 11C, an oxide layer 24 may be formed on the first surface 101 of the semiconductor body 100 before the planarizing process. This oxide layer 24 may be removed after the planarization process or may be used in the process of forming the transistor cells.

The transistor device shown in FIG. 18 can be controlled in a conventional way by applying a drive voltage between the gate node G and the source node S, wherein the transistor device is in an on-state when the drive voltage generates a conducting channel in the body regions 13 along the gate dielectrics 16 between the source regions 14 and the first regions 11. The first regions 11 are drift regions in this transistor device. The transistor device is in the off-state when the drive voltage is such that the conducting channels are interrupted. When, in the off-state, a voltage is applied between the source node and the drain node that reverse biases pn-junctions between the body regions 13 and the drift regions 11 a depletion regions expands in the drift regions 11 and the second regions 12, which are compensation regions in the transistor device.

Referring to FIG. 18, the edge termination structure with the trench insulation layer 21 may further include a field electrode (field plate) 51 formed on top of the trench insulation layer 21. This field electrode 51 is connected to the gate node G (as illustrated.) or to the source node S (not illustrated). This field electrode 51, which is electrically insulated from the semiconductor body 100 by the trench insulation layer, may help to shape an electric field occurring in the edge region 120 in the off-state such that a voltage blocking capability in the edge region is not lower than in the inner region. According to one example, first and second regions 11, 12 are also formed in the edge region 120 below the trench insulation layer 21.

In the example illustrated in FIG. 18, the gate electrodes 15 are planar gate electrodes that formed on top of the first surface 101. This, however, is only an example. According to another example illustrated in FIG. 19, the gate electrodes 15 are trench electrodes formed in trenches extending from the first surface 101 into the semiconductor body 100.

Forming transistor cells as explained with reference to FIGS. 18 and 19 may include one or more planarization processes. Due to the planar surface of the structure with the semiconductor body 100 and the trench insulation layer 21 before forming the transistor cells such planarization processes can easily be performed. In the process of forming the transistor device according to FIG. 18, a planarization process may take place, for example, before or after forming contact holes in which the source electrode 41 (later) is connected to the body and source regions 13, 14. In the process of forming the transistor device according to FIG. 19, a planarization process may take place, for example, after forming the gate electrodes 41 in the trenches.

Referring to FIGS. 10A-10B, 11A-11C and 12A-12C, for example, a planarizing process may be used in the process of forming the trench insulation layer 21 for removing residuals 23 of the insulation layer 20. According to one example, the same planarization process is used to remove the residuals 23 of the insulation layer 20 and to planarize the semiconductor body 100 above the inner region 110. That is, the insulation layer 20 may be removed from above the surface 101 of the semiconductor body 100, the transistor cells may at least be partially formed, and then the planarization process may take place.

Figure 19:
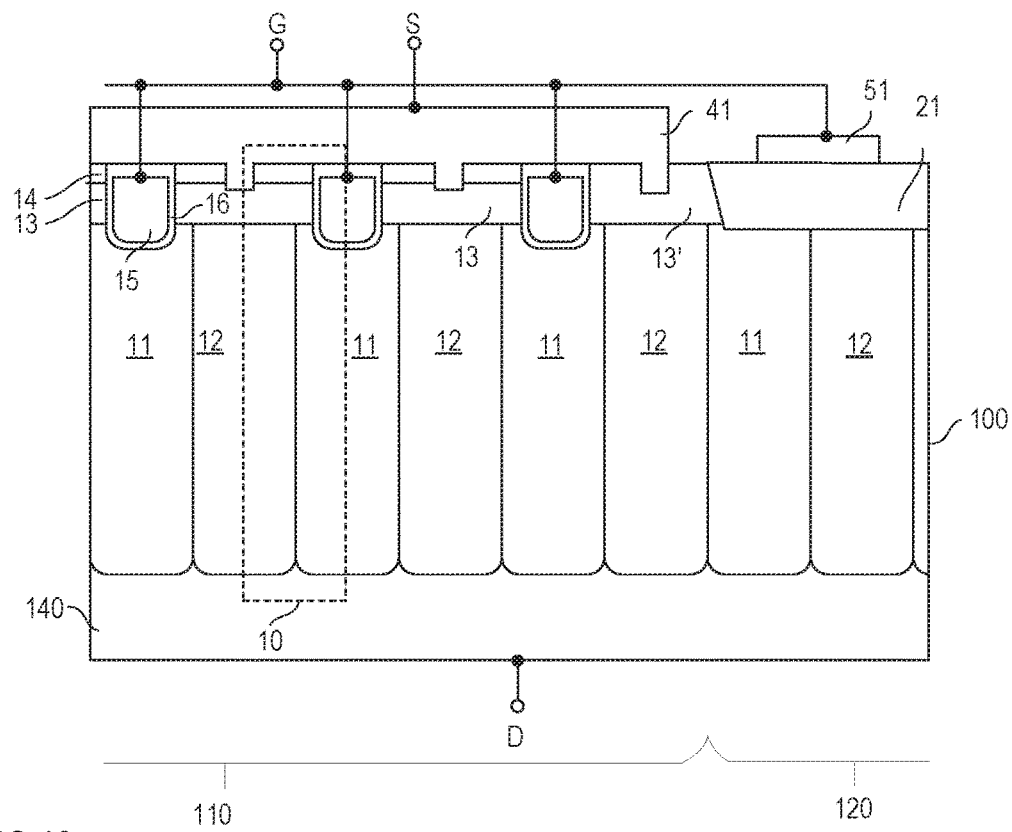
FIG. 19 shows a vertical cross sectional view of a superjunction transistor device according to another example.

In the superjunction transistor devices according to FIGS. 18 and 19, a body region 13 or, as illustrated, a modified body region 13' may adjoin the trench insulation layer 21. The modified body region 13' may have the same doping concentration as the body regions 13, is connected to the source electrode 41, but does not include/adjoin a source region 14. The trench insulation layer 21 may extend deeper into the semiconductor body 100 than the body regions 13 or modified body regions 13'.

Figure 20:
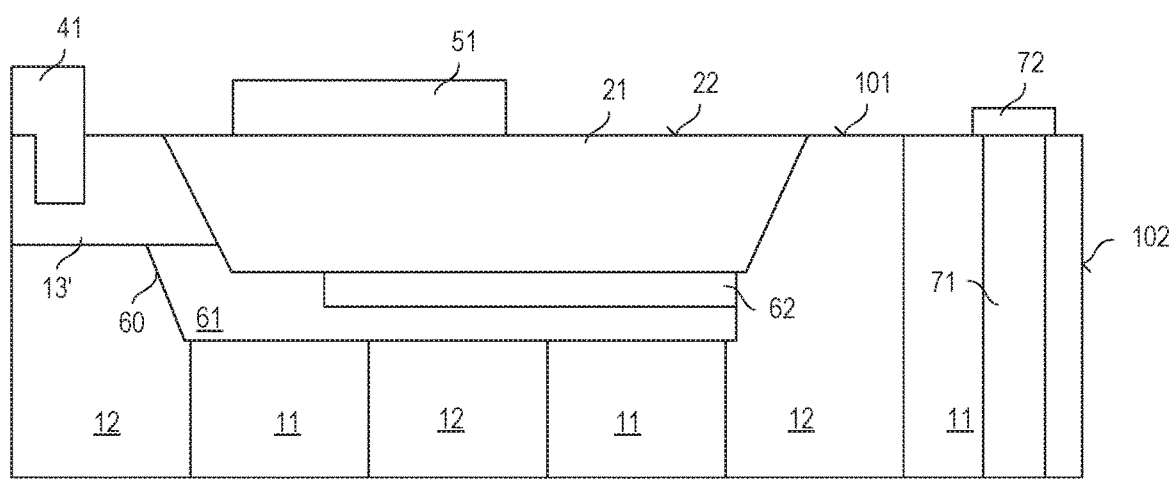
FIG. 20 illustrates one example of an edge termination structure including a trench insulation layer in detail.

In the superjunction transistor devices illustrated in FIGS. 18 and 19, the trench insulation layer 21 is part of an edge termination structure. In these examples, the drift and compensation regions 11, 12, in the edge region 120, extend to the trench insulation layer 21. This, however, is only an example. According to another example illustrated in FIG. 20, a JTE (Junction Termination Extension) structure 60 extends below the trench insulation layer 21. The JTE structure 60 is connected to the source electrode 41 and has an effective doping concentration of the second doping type, wherein the doping concentration decreases in a direction facing away from the inner region 110. The JTE structure is connected to the source electrode 41 via a body region 13 or the modified body region 13', as illustrated in FIG. 20. The decreasing doping concentration of the JTE structure 60 can be obtained by implementing the JTE structure 60 with a first region 61 of the second doping type that adjoins the modified body region 13' and a second region 62 of the first doping type that adjoins the first region 61 and is spaced apart from the modified body region 13' in a direction facing away from the inner region 110.

Referring to FIG. 20, the edge termination structure may further include a channel stopper 71 of the first doping type that extends from the first surface 101 in the vertical direction to the drain region (not shown in FIG. 20). The channel stopper 71 is arranged between the trench insulation layer 21 and an edge surface 102 that terminates the semiconductor body 100 in lateral directions. The channel stopper may be implemented such that it forms a closed loop around the inner region 110. Further, an electrically conducting field plate 72 may be arranged on top of the channel stopper 71 on the surface 101 of the semiconductor body 100. According to one example, a doping concentration of the channel stopper 71 is such that the channel stopper cannot be completely depleted. The semiconductor structure with the JTE region 60 and the drift and compensation regions 11, 12 between the channel stopper 71 and the inner region 110, however, can be depleted completely.

According to one example, a depth of the trench insulation layer 21 is between 0.1 micrometers and 0.5 micrometers, in particular between 0.2 micrometers and 0.5 micrometers. The "depth" is the dimension of the trench insulation layer 21 in the vertical direction, which is the direction perpendicular to the first surface 101.

Figure 21:
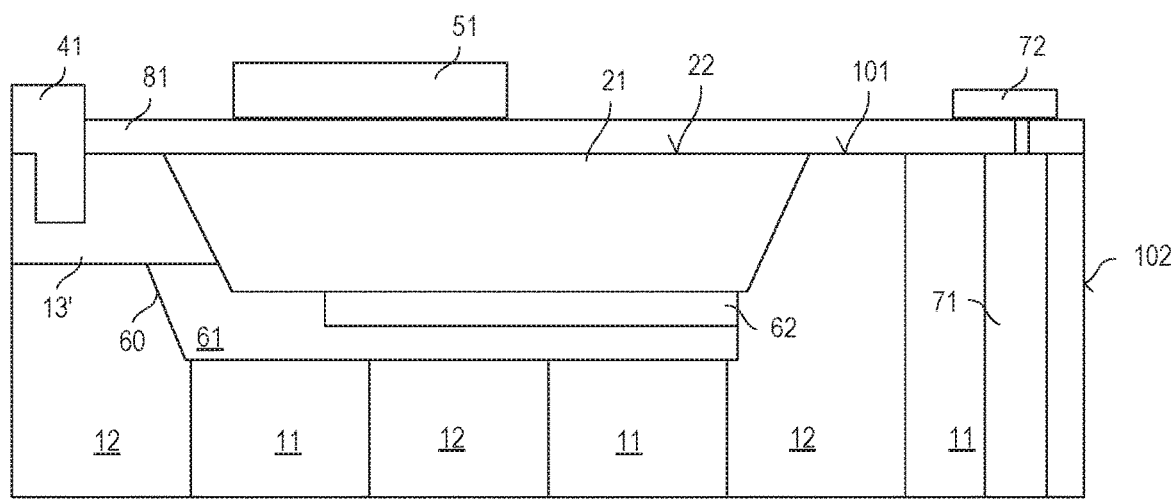
FIG. 21 illustrates a modification of the edge termination structure shown in FIG. 20.

In the examples illustrated in FIGS. 18 to 20, the field electrode 51 is arranged on the trench insulation layer 21, wherein the trench insulation layer 21 and the semiconductor body 100 form an essentially planar surface. According to another example shown in FIG. 21, a further insulation layer 81 such as an oxide layer is formed on the trench insulation layer 21 and the field electrode 51 is formed on the further insulation layer 81. Referring to FIG. 21, the further insulation layer 81 may also cover sections of the planar surface 101 of the semiconductor body 100. Further, field plate 72 may be arranged on top of the further insulation layer 81 and may be connected to the channel stopper 71 by an electrically conducting via that extends through the further insulation layer 81.

The further insulation layer 81 may be formed in a deposition process. Dependent on how the further insulation layer 81 is formed there may be no visible border between the trench insulation layer 21 and the further insulation layer 81. However, for illustration purposes such border is illustrated in FIG. 21.

Although the present disclosure is not so limited, the following numbered examples demonstrate one or more aspects of the disclosure.

Example 1. A method, including: forming a trench in a first surface in an edge region of a semiconductor body; forming an insulation layer in the trench and on the first surface of the semiconductor body; and planarizing the insulation layer so that a trench insulation layer that fills the trench remains, wherein forming the insulation layer includes a thermal oxidation process.

Example 2. The method of example 1, wherein forming the trench includes forming the trench such that it surrounds an inner region adjoining the edge region.

Example 3. The method of example 1 or 2, wherein planarizing the insulation layer includes at least partially removing the insulation layer from above the first surface of the semiconductor body.

Example 4. The method of example 3, wherein at least partially removing the insulation layer from above the first surface of the semiconductor body includes completely removing the insulation layer from above the first surface of the semiconductor body.

Example 5. The method of example 3 or 4, wherein at least partially removing the insulation layer from above the first surface of the semiconductor body includes a polishing process.

Example 6. The method of example 3 or 4, wherein at least partially removing the insulation layer from above the first surface of the semiconductor body includes: removing sections of the insulation layer from above the first surface by an etching process such that residuals of the insulation layer that protrude from the semiconductor body remain; at least partially removing the residuals by a polishing process.

Example 7. The method of example 6, further including: forming at least one of a further oxide layer and a nitride layer on uncovered sections of the first surface before the polishing process, wherein the at least one of the further oxide layer and a nitride layer acts as a stop layer of the polishing process.

Example 8. The method of example 6 or 7, wherein the polishing process partially removes the trench insulation layer.

Example 9. The method of any one of the preceding examples further includes: before forming the insulation layer, forming a plurality of first implanted regions each including dopant atoms of a first doping type and a plurality of second implanted regions each including dopant atoms of a second doping type in the semiconductor body.

Example 10. The method of example 9, wherein forming the plurality of first implanted regions and the plurality of second implanted regions includes: forming a plurality of epitaxial layers one above the other; forming a plurality of trenches in at least some of the plurality of semiconductor layers before forming a respective next one of the plurality of semiconductor layers; and introducing first type dopant atoms at least into first sidewalls of the plurality of trenches and introducing second type dopant atoms at least into second sidewalls of the plurality of trenches.

Example 11. The method of example 10, wherein introducing first type dopant atoms at least into first sidewalls of the plurality of trenches includes introducing first type dopant atoms into both first sidewalls and second sidewalls of the plurality of trenches, and wherein introducing second type dopant atoms at least into first sidewalls of the plurality of trenches includes introducing second type dopant atoms into both first sidewalls and second sidewalls of the plurality of trenches.

Example 12. The method of any one of the preceding examples, further including: forming a plurality of transistor cells in an inner region adjoining the edge region.

Example 13. The method of any one of the preceding examples, further including: forming a field electrode on the trench insulation layer.

Example 14. The method of any one of the preceding examples, wherein the first surface is entirely oxidized in the thermal oxidation process.

Example 15. The method of any one of the preceding examples, wherein a thickness of a thermal oxidation layer formed by the thermal oxidation process is between 0.2 times and 1.3 times or between 0.3 times and 1.1 times a depth of the trench.

Example 16. The method of any one of the preceding examples, wherein an aspect ratio of the trench is less than 1, less than 0.1, less than 0.025, or less than 0.01.

Example 17. A transistor device, including: a plurality of superjunction transistor cells in an inner region of a semiconductor body; a trench insulation layer arranged in an edge region of the semiconductor body and extending in a vertical direction of the semiconductor body from a first surface of the semiconductor body into the semiconductor body.

Example 18. The transistor device of example 17, wherein a depth of the trench insulation layer in the vertical direction is between 0.1 micrometers and 0.5 micrometers.

Example 19. The transistor device of example 17 or 18, further including: a further insulation layer formed on top of the trench insulation layer.

Example 20. The transistor device of example 17, further including: an electrically conducting field plate either on top of a surface of the trench insulation layer or on top of a surface of the further insulation layer, wherein the field plate is connected to a source node or a gate of the transistor device.

Example 21. The transistor device of any one of examples 17 to 20, wherein the trench insulation layer forms a closed loop around the inner region.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

The invention claimed is:

1. A method, comprising:
forming a trench in a first surface in an edge region of a semiconductor body;
forming an insulation layer in the trench and on the first surface of the semiconductor body;
planarizing the insulation layer so that a trench insulation layer that fills the trench remains, and
forming a plurality of transistor cells in an inner region adjoining the edge region,
wherein forming the insulation layer comprises a thermal oxidation process,
wherein the trench is completely filled by the trench insulation layer after completing the
formation of the transistor cells.

2. The method of claim 1, wherein forming the trench comprises forming the trench such that it surrounds an inner region adjoining the edge region.

3. The method of claim 1,
wherein planarizing the insulation layer comprises at least partially removing the insulation layer from above the first surface of the semiconductor body.

4. The method of claim 3, wherein at least partially removing the insulation layer from above the first surface of the semiconductor body comprises completely removing the insulation layer from above the first surface of the semiconductor body.

5. The method of claim 3, wherein at least partially removing the insulation layer from above the first surface of the semiconductor body comprises a polishing process.

6. The method of claim 3, wherein at least partially removing the insulation layer from above the first surface of the semiconductor body comprises:
removing sections of the insulation layer from above the first surface by an etching process such that residuals of the insulation layer that protrude from the semiconductor body remain; and
at least partially removing the residuals by a polishing process.

7. The method of claim 6, further comprising:
forming at least one of a further oxide layer and a nitride layer on uncovered sections of the first surface before the polishing process,
wherein the at least one of the further oxide layer and a nitride layer acts as a stop layer of the polishing process.

8. The method of claim 6, wherein the polishing process partially removes the trench insulation layer.

9. The method of claim 1, further comprising:
before forming the insulation layer, forming a plurality of first implanted regions each of the first implanted regions comprising dopant atoms of a first doping type and a plurality of second implanted regions each of the second implanted regions comprising dopant atoms of a second doping type in the semiconductor body.

10. The method of claim 9, wherein forming the plurality of first implanted regions and the plurality of second implanted regions comprises:
forming a plurality of epitaxial layers one above the other;
forming a plurality of trenches in at least some of the plurality of epitaxial layers before forming a respective next one of the plurality of epitaxial layers; and
introducing first type dopant atoms at least into first sidewalls of the plurality of trenches and introducing second type dopant atoms at least into second sidewalls of the plurality of trenches.

11. The method of claim 10,
wherein introducing first type dopant atoms at least into first sidewalls of the plurality of trenches comprises introducing first type dopant atoms into both first sidewalls and second sidewalls of the plurality of trenches, and
wherein introducing second type dopant atoms at least into first sidewalls of the plurality of trenches comprises introducing second type dopant atoms into both first sidewalls and second sidewalls of the plurality of trenches.

12. The method of claim 1, further comprising:
forming a field electrode on the trench insulation layer.

13. The method of claim 1, wherein the first surface is entirely oxidized in the thermal oxidation process.

14. The method of claim 1, wherein a thickness of a thermal oxidation layer formed by the thermal oxidation process is between 0.2 times and 1.3 times a depth of the trench.

15. The method of claim 1,
wherein an aspect ratio of the trench is less than 1.

16. A transistor device, comprising:
a plurality of superjunction transistor cells in an inner region of a semiconductor body;
a trench insulation layer arranged in an edge region of the semiconductor body and extending in a vertical direction of the semiconductor body from a first surface of the semiconductor body into the semiconductor body,
wherein the edge region comprises a trench that is exclusively filled by the trench insulation layer.

17. The transistor device of claim 16, wherein a depth of the trench insulation layer in the vertical direction is between 0.1 micrometers and 0.5 micrometers.

18. The transistor device of claim 16, further comprising:
a further insulation layer formed on top of the trench insulation layer.

19. The transistor device of claim 16, further comprising:
an electrically conducting field plate either on top of a surface of the trench insulation layer or on top of a surface of the further insulation layer,
wherein the field plate is connected to a source node or a gate of the transistor device.

20. The transistor device of claim 16, wherein the trench insulation layer forms a closed loop around the inner region.

21. The transistor device of claim 16, wherein a depth of the trench insulation layer in the vertical direction is between 0.1 micrometers and 0.5 micrometers.

22. The method of claim 1, wherein the edge region of the semiconductor body extends from an outer edge of the semiconductor body to the inner region, and wherein the trench is the only trench in the edge region.

23. The transistor device of claim 16, wherein the edge region of the semiconductor body extends from an outer edge of the semiconductor body to the inner region, and wherein the trench is the only trench in the edge region.

\* \* \* \* \*